United States Patent [19]

Pinnavaia

[11] Patent Number: 5,061,845
[45] Date of Patent: Oct. 29, 1991

[54] MEMORY CARD

[75] Inventor: Giuseppe Pinnavaia, Rieti, Italy

[73] Assignee: Texas Instruments Incorporated, Dallas, Tex.

[21] Appl. No.: 515,809

[22] Filed: Apr. 30, 1990

[51] Int. Cl.⁵ .................. H05K 5/00; G06K 19/06
[52] U.S. Cl. ........................ 235/492; 235/487; 361/395; 361/399
[58] Field of Search .............. 235/487, 88, 492; 361/392, 94, 395, 99; 439/76, 77, 152, 153, 492–499

[56] References Cited

U.S. PATENT DOCUMENTS

| | | | |
|---|---|---|---|
| 3,372,310 | 3/1968 | Kantor | 361/392 |
| 4,386,388 | 5/1983 | Beun | 361/394 X |
| 4,789,347 | 12/1988 | Banjo et al. | 439/140 |
| 4,798,946 | 12/1989 | Fujii et al. | 235/492 |
| 4,811,165 | 3/1989 | Currier et al. | 361/399 X |
| 4,838,804 | 6/1989 | Banjo et al. | 439/325 |
| 4,854,883 | 8/1989 | Tuckwood | 439/492 X |
| 4,864,116 | 9/1989 | Banjo et al. | 235/492 |
| 4,872,091 | 10/1989 | Maniwa et al. | 361/399 X |
| 4,889,498 | 12/1989 | Mizuta | 439/76 X |
| 4,941,835 | 7/1990 | Lasmayoux et al. | 439/152 |
| 4,975,805 | 12/1990 | Schmutzler | 361/392 X |

Primary Examiner—Stuart S. Levy
Assistant Examiner—Steven M. DuBois
Attorney, Agent, or Firm—Melvin Sharp; N. Rhys Merret; Lawrence J. Bassuk

[57] ABSTRACT

A shell having symmetrical top and bottom parts form a chamber containing a substrate carrying package semiconductor devices and a connector. A cover fits in a hollow of the top part normally for its top surface to rest flush with the top surface of the top part. The packaged semiconductor devices on the substrate extend through apertures in the top part with the top surfaces of the packaged semiconductor devices resting substantially flush with the top surface of the top part. The cover flexes over the packaged semiconductor devices at those locations. Gripping means occur in the ends of the shell opposite the connector to aid removal of the memory card from a desired port and an interior wall and side pockets provide stress relief for removal and insertion of the connector in the desired port.

28 Claims, 4 Drawing Sheets

MEMORY CARD

FIELD OF INVENTION

This invention relates to the field of packaging plural semiconductor devices in a common container and particularly relates to packaging plural semiconductor memory and related devices, such as DRAMs, SRAMs, ROMs, and PROMs or other non-volatile memory, in a container about the size of a credit card that is readily handled by a user and pluggable in desired equipment.

DESCRIPTION OF THE RELATED ART

Credit card sized memory cards are commercially available, such as MF3129-M7DAC01 from Mitsubishi Electric Corporation. This particular card contains 128KB of static random access memory (SRAM) powered by a contained battery. The card container has dimensions of about 85×54×about 3.6 millimeters, has an electrical connector at one end and a cavity at the other end for receiving and holding the battery. It also has a slide switch at the other end operated to turn a write protect feature on and off.

The referenced memory card is constructed by mounting the individual semiconductor memory and related devices on a thin printed circuit board and attaching a connector to the board. A plastic molded frame having a marginal and transverse skeleton and internal openings mates with the printed circuit board and connector combination. Top and bottom panels of such as sheet metal then mount over the openings through the frame to enclose the printed circuit board and semiconductor devices. Later, the battery can be inserted in its opening and be secured in placed with a plastic holder and screws. Adhesive sheets, one each on the top and bottom, secure the panels in place and insulate them from the enclosed semiconductor devices.

These memory cards find utility in several electronic systems. In personal computers they supplement or replace floppy disks by carrying software programs and data and are connected to the internal logic through a port on such as the side of the logic cabinet. Portable personal computers particularly find memory cards convenient because they avoid the need for the expense, power requirements, bulk, and weight of a disk drive; the memory card needs only an electrical connector and minimal structural support.

Laser printers can use a memory card to store desired memory fonts. Game cartridges carry the specifics of games to be enacted on TV screens by the players.

Additionally, memory expansion can occur in the future by plugging additional memory cards into ports on the side of the personal computer cabinet. This eliminates expanding the computer memory by powering off the computer, removing the cabinet cover, plugging an additional SIM card (Single Inline Module) in a proper, difficult to reach location on the mother board, setting the proper DIP switches to re-configure the computer memory addresses, returning the cabinet cover to its proper position and powering up the computer. With a memory card, the user just plugs the desired memory card in a port.

Other areas that can benefit from the use of memory cards include bulk data acquisition such as in music and photography, where the desired song or picture is stored in the memory devices of the card.

SUMMARY OF THE INVENTION

The invention introduces a memory card construction furnishing a symmetrical shell presenting an interior chamber open to one end. A substrate, such as a printed circuit board carrying leads, packaged semiconductor devices and a connector, fits in the chamber with the connector extending through the opening to outside of the shell. A first or top part of the shell includes apertures opening to the chamber and the packages of the semiconductor devices extend into the apertures. A cover of flexible insulating material is adhesively mounted on the shell top part enclosing the apertures and semiconductor packages to seal the same from the environment.

This arrangement furnishes a thin and readily manufactured memory card with minimal parts and standard manufacturing procedures. Extending the device packages through the apertures and enclosing the apertures and packages with the cover obtains a thin card. Moreso, the first or top part of the shell presents a hollow receiving the cover so that the top of the cover normally rests flush with the top surface of the shell. The substrate, packaged devices and shell are dimensioned however, so that the top surfaces of the packages stand flush with the top surface of the shell and with the cover being raised and flexing over the packages at those locations. This attains an apparently thinner memory card than if the top surface of the cover laid flush with the shell top surface over its entire area.

The invention also introduces a neck portion of the shell adjacent the connector with a thickness reduced to the thickness of the connector; the rest of the shell has a uniformly greater thickness. This attains the necessary thinness at the connector with a slightly thicker body portion.

The invention also introduces gripping means in the form of ridges arranged on the shell opposite the opening or connector. These ridges occur on the side edges of the shell and on the top and bottom surfaces. These ridges mainly aid or facilitate removal of the memory card from a receiving port or connector as desired.

The shell also presents pockets on sides of the opening for receiving ears on the connector to retain the connector in the shell at a desired position, and an upstanding wall in the chamber to retain the substrate and connector in position. These features also serve as strain reliefs for stresses encountered with plugging and unplugging the connector into and out of a mating connector.

The shell consists of first and second or top and bottom parts molded of plastic material. The top and bottom parts are symmetrical with one another and engage or mate with one another only along their outer margins to provide the chamber free of obstructions. A tongue and groove arrangement extends along the margins of both parts to align the parts at assembly. Localized heating then joins the parts together at the margins and tongue and groove arrangement.

DESCRIPTION OF THE PREFERRED EMBODIMENT

Figure 1:
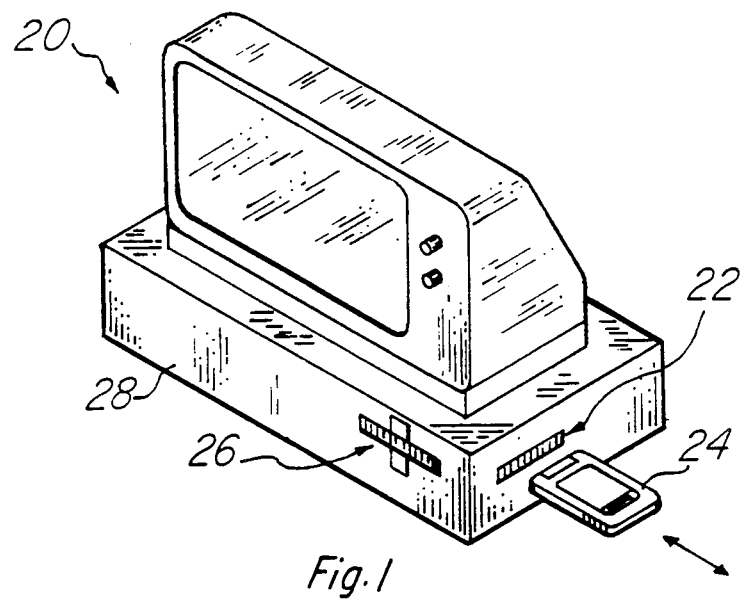
FIG. 1 is a perspective view of a personal computer using the memory card of the invention.

In FIG. 1, personal computer 20 includes a port 22 receiving a memory card 24 of the invention for any one of several purposes. These can include augmentation of the semiconductor memory of the personal computer, presenting software or data to the personal computer through the port 22 or reconfiguration of the personal computer 20 through information carried in the solid state or semiconductor memory devices carried in memory card 24. This occurs in addition to or in substitution for the floppy disk port 26, also located on the cabinet 28 of the personal computer.

Figure 2:
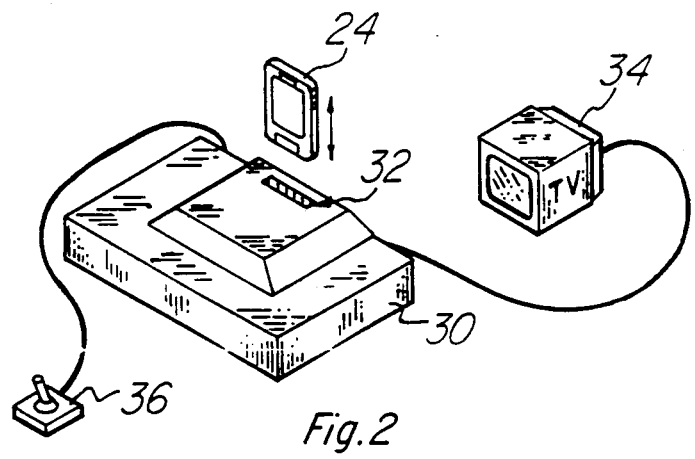
FIG. 2 is a perspective view of a game controller using the memory card of the invention.

In FIG. 2, a game controller 30 receives the memory card 24 through a port 32. In this instance, the memory card 24 carries software and data for the controller to execute a gate displayed on TV 34 in response to the user effecting actions on the joystick 36.

Figure 3:
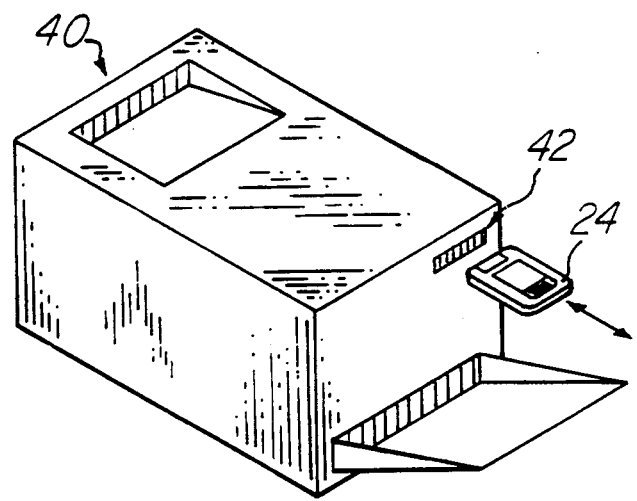
FIG. 3 is a perspective view of a laser printer using the memory card of the invention.

In FIG. 3, laser printer 40 receives memory card 24 at port 42 for controlling the type fonts or other desired features of the laser printer.

Figure 4:
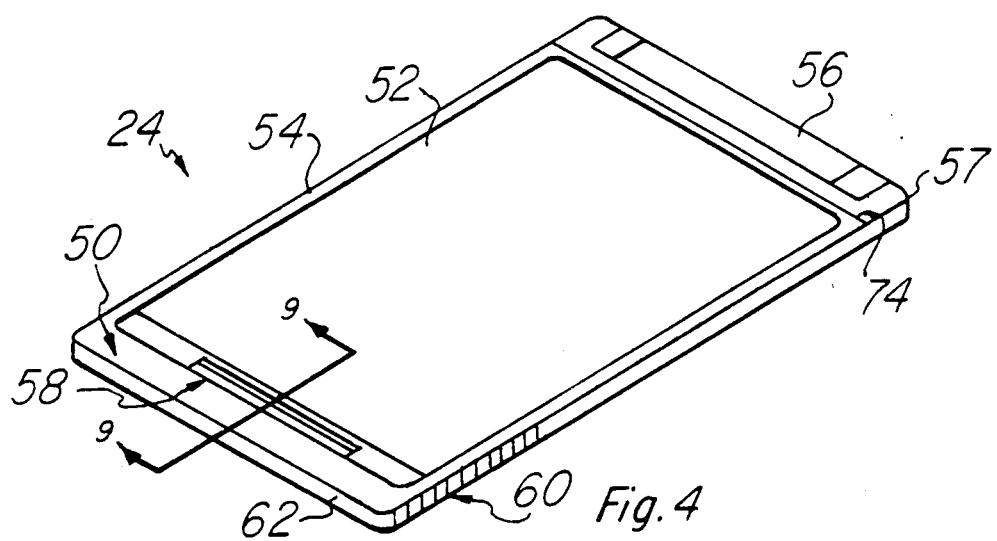
FIG. 4 is a perspective view of the top of a memory card of the invention.

In FIG. 4, memory card 24 comprises a shell 50 and a cover 52 received in a hollow 54 of the top part of the shell 50. connector 56 extends to one end of the memory card. Connector 56 can be a standard connector available from Molex or DuPont. Gripping means 58 and 60 occur on the other end of the shell 50. A to facilitate removal of the memory card from any of the previously described ports.

Figure 5:
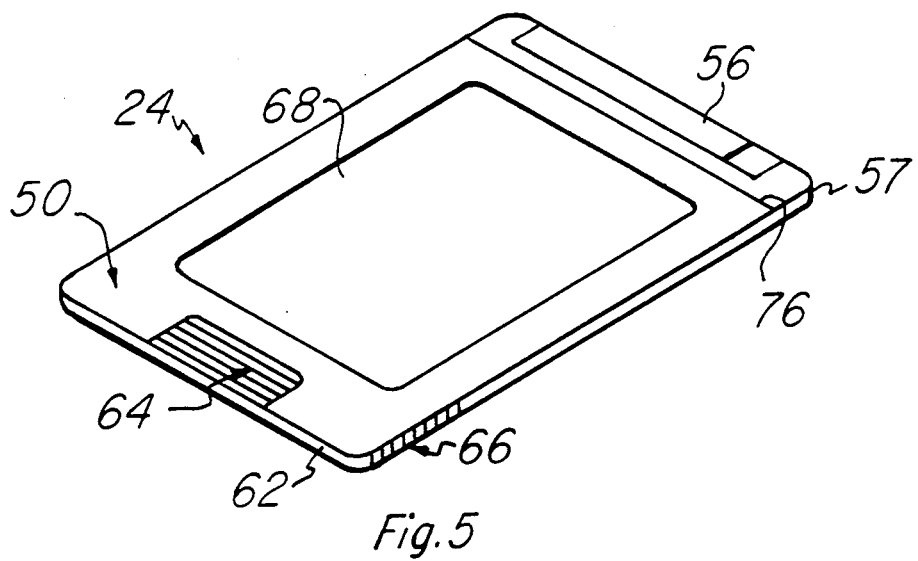
FIG. 5 is a perspective view of the bottom of the memory card of the invention.

In FIG. 5, the bottom side of shell 50 carries additional gripping means 64 and 66. The gripping means 60 and 66 cooperate by the user placing his thumb and index finger on opposite edges of the memory card for removing the memory card from a described port. Gripping means 58 and 64 cooperate with a user placing his thumbnail in gripping means 58 and his index finger on gripping means 64 to remove the memory card 24 from a described port.

Shell 50 also includes another hollow 68 in its bottom side to receive such as a label (not shown) carrying identifying indicia.

Figure 6:
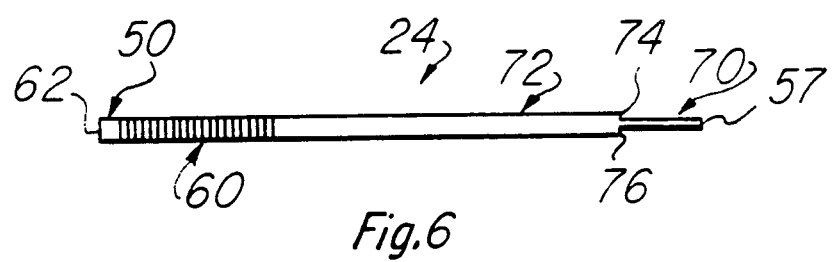
FIG. 6 is a side elevational view of the memory card of the invention.

In FIG. 6, memory card 24 includes a reduced thickness neck portion 70 and a body portion 72. The neck portion 70 extends from lips 72 and 74 also indicated in FIGS. 4 and 5 respectively. Neck portion 70 encompasses connector 56 and has a thickness of about 3 millimeters. This reduced thickness neck portion facilitates insertion of the memory card 24 in a desired port while providing increased thickness for containing the packaged semiconductor memory devices in body portion 72. Body portion 72 has a uniform thickness of about 4 millimeters.

Figure 7:
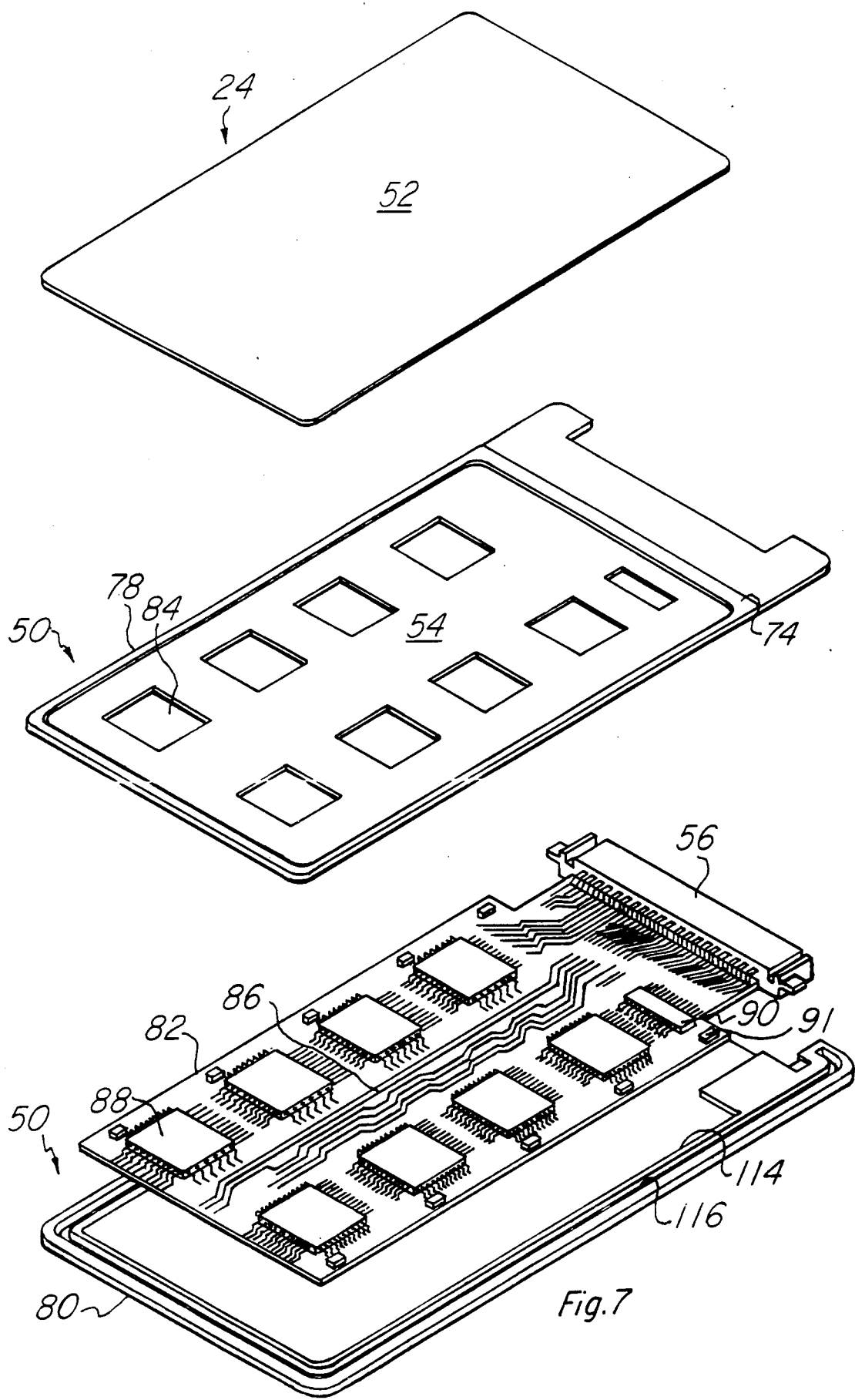
FIG. 7 is an exploded perspective view of the memory card of the invention.

In FIG. 7, memory card 24 comprises cover 52, shell 50 formed of first or top part 78 and second or bottom part 80 and substrate 82. Top and bottom parts 78 and 80 are joined together at their margins to form an interior chamber containing the substrate 82. Top part 78 also includes plural apertures 84 opening to the contained chamber.

Substrate 82 forms an assembly carrying printed circuit leads 86, plural packaged semiconductor devices 88 and connector 56. The packaged semiconductor devices and the connector 56 are connected to selected leads to effect the desired memory device function. For example, the memory devices can include four 32K×8 OTPROM devices manufactured by Texas Instruments, Inc. under part number TMS27PC256FR. Other devices such as device 90 also can be provided for additional drive capabilities or desired logic functions. As will be explained presently, the packaged semiconductor devices 88 and 90 are aligned with the apertures 84 to extend into the apertures 84 after assembly of the memory card. Other components such as de-coupling capacitors 91 can also be mounted on the substrate as desired.

Figure 8:
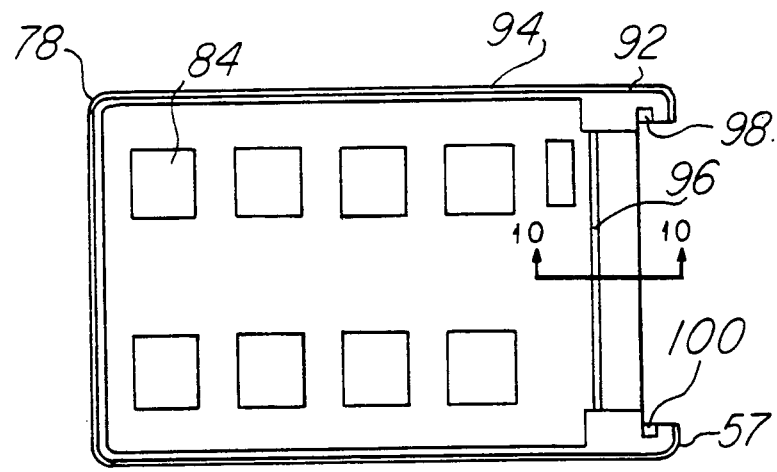
FIG. 8 is a bottom view of the shell top part of the memory card of the invention.
Figure 9:
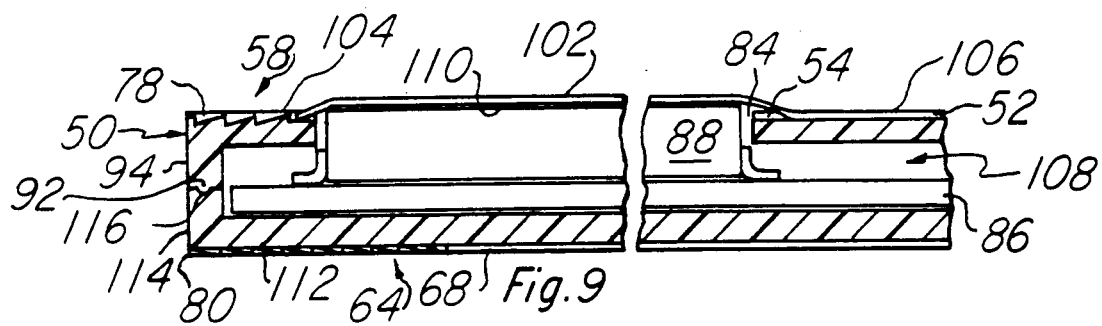
FIG. 9 is an enlarged partial sectional view of the memory card taken along the line 9—9 in FIG. 1.
Figure 10:
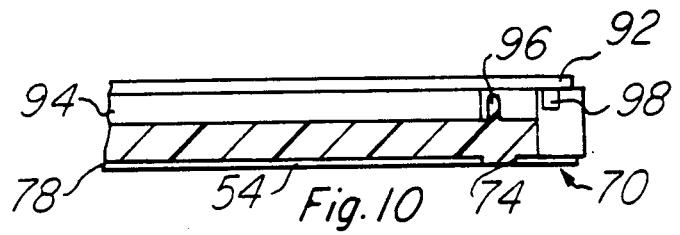
FIG. 10 is an enlarged partial sectional view of the memory card taken along the line 10—10 in FIG. 8.

In FIGS. 8, 9 and 10, top part 78 presents a tongue 92 in the form of a small bead of material extending along the upstanding outer margin 94. Top part 78 also presents an upstanding wall 96 and a pair of pockets 98 and 100. This wall 96 and pockets 98 and 100 serve to position and retain the connector 56 and to provide strain relief when inserting the connector into a mating connector or unplugging the connector 56 from a mating connector.

With the exception of the tongue 92, the apertures 84 and the upstanding wall 96, the bottom part 80 is substantially a symmetrical duplicate of the top part 78. FIG. 7 depicts the groove 116 that mates with the tongue 92 of top part 78 for aligning the two shell parts.

Referring particularly to FIG. 9, pocket 54 normally receives cover 52 so that the top surface 102 of the cover normally rests flush with the top surface 104 of the top part 78 of shell 50. This stands depicted particularly at area 106. The substrate 86 normally rests in chamber 108 with packaged device 88 extending upwardly through aperture 84 for its top surface 110 to be substantially flush with the top surface 104 of the top part 78. This causes the cover 52 above the device 88 to be raised above the top surface 104 of the top part 78. Because the cover 52 carries an adhesive layer on its bottom surface, it completely overlays the device 88 and the aperture 84 to encompass and enclose both structures and to seal the device and aperture from contact with the environment. This seal can be as good or as poor as desired. In practice, this raising the cover over the height of the package semiconductor device 88 becomes imperceptible to a user and the memory card appears to have a thickness only of that of the shell 50.

This provides for the semiconductor devices 88 to be mounted on substrate 86 with standard automated manufacturing procedures. This facilitates usual inexpensive manufacturing of the substrate by using standard surface mount technology semiconductor packaging for devices 88. This maintains the cost to a minimum. Altogether, this obtains the memory card in a very thin package at a very low cost. Without the present invention, the top part 78 would have to cover the packages of the semiconductor devices 88 and result in a thicker memory card.

Gripping means 58 and 64 comprise ridges such as ridge 112 formed in the material of shell 50 for facilitating removal of the memory card from a desired port.

Referring to FIGS. 7 and 9, second or bottom part 80, like top part 78 comprises an upstanding outer margin 114. Upstanding outer margin 114 presents a groove 116 extending along the length of the outer margin 114 to receive the tongue 92 from top part 78. This furnishes a simple and inexpensive tongue and groove arrangement for aligning the top and bottom parts during assembly. Joining the top and bottom parts can occur by localized heating to melt the tongue into the groove material.

Figure 11:
FIG. 11 is an enlarged partial plan view of the edge of the shell of the memory card of the invention.

In FIG. 11, the gripping means 66 and shell 50 comprises ridges such as ridge 118 to aid in removal of the memory card from a desired port.

The memory card disclosed can be used other than as specifically described. For example, different memory devices or logic can be used in place of the packaged semiconductor devices 88 and thinner packaged semiconductor devices can be used in place of those depicted in FIG. 9. Such thinner packaged semiconductor devices further would reduce the thickness of the body of the memory card.

I claim:

1. A memory card comprising:
   A. a shell forming a substantially rigid frame of said memory card, said shell having first and second parts joined together at their margins and presenting an interior chamber between said margins and opening to one end of the shell, said first part including a substantially flat central portion and said first part presenting plural apertures opening through said central portion of said chamber;
   B. a substrate carrying circuit leads contained within said chamber, said substrate also carrying packaged semiconductor devices electrically connected to selected circuit leads and a connector electrically connected to selected circuit leads, said packages of said semiconductor devices having a thickness at least as great as said first part central portion and extending into said apertures in said first part so that the top surfaces of said packages stand at least flush with the top surface of said first part, and said connector extending from said chamber to said one end through said opening; and
   C. a cover mounted on said shell first part and enclosing said apertures.

2. The memory card of claim 1 in which the margins of said first and second parts include a tongue and groove arrangement for alignment.

3. The memory card of claim 1 in which said first part includes a hollow arranged and dimensioned relative to said cover for receiving said cover so that the top surface of said cover normally rests flush with the top surface of said shell first part.

4. The memory card of claim 1 in which said cover rests on said top surfaces of said packages.

5. The memory card of claim 1 including a wall upstanding from said shell into said chamber adjacent said opening, said wall being arranged relative to said substrate to retain said substrate and connector in said shell.

6. The memory card of claim 1 in which said shell includes opposed pockets adjacent said opening and said connector includes ears that fit into said pockets to retain said connector in said shell.

7. The memory card of claim 1 in which said shell includes gripping means for aiding in the removal of said memory card from a desired location.

8. The memory card of claim 7 in which said gripping means include at least one ridge on another end of said shell opposite said one end.

9. The memory card of claim 8 in which said gripping means include at least one ridge on each of said shell first and second parts.

10. The memory card of claim 7 in which said gripping means include plural ridges that are located on edges of said shell and that are located opposite said one end.

11. The memory card of claim 1 in which said cover is a thin sheet of flexible, insulative material adhesively mounted on said shell first part.

12. The memory card of claim 1 in which said shell first and second parts are molded plastic.

13. The memory card of claim 1 in which said substrate is a printed circuit board.

14. The memory card of claim 1 in which said shell includes a portion adjacent said connector that has a thickness less than the rest of said shell and of the same thickness as said connector.

15. The memory card of claim 1 in which said first part is a top part and said second part is a bottom part.

16. A memory card comprising:
   A. a shell presenting an interior chamber opening to one end of the shell, said shell including plural apertures opening to said chamber;
   B. a substrate carrying circuit leads contained within said chamber, said substrate also carrying packaged semiconductor devices electrically connected to selected circuit leads and a connector electrically connected to selected circuit leads, said packages of said semiconductor devices extending into said apertures in said shell and said connector extending from said chamber to said one end through said opening; and
   C. a cover mounted on said shell and enclosing said apertures, said shell including a hollow arranged and dimensioned relative to said cover for receiving said cover so that the top surface of said cover normally rests flush with the top surface of said shell.

17. The memory card of claim 16 in which said hollow is centrally located between said margins of said first part.

18. The memory card of claim 16 in which said cover is flexible.

19. A memory card comprising:
   A. a shell having first and second parts joined together at their margins and presenting an interior chamber between said margins and opening to one end of the shell;
   B. a substrate carrying circuit leads contained within said chamber, said substrate also carrying packaged semiconductor devices electrically connected to selected circuit leads and a connector electrically connected to selected circuit leads, and said connector extending from said chamber to said one end through said opening; and
   C. said shell including a wall upstanding from said shell into said chamber adjacent said opening, said wall being arranged relative to said substrate to engage and retain said substrate and connector in said shell.

20. The memory card of claim 19 in which said wall upstands from said first part.

21. The memory card of claim 19 in which said wall extends across said opening.

22. The memory card of claim 19 in which said wall upstands from said first part and said second part clamps said substrate between said wall and second part when said parts are joined.

23. A memory card comprising:
   A. a shell having first and second parts joined together at their margins and presenting an interior chamber between said margins and opening to one end of the shell;
   B. a substrate carrying circuit leads contained within said chamber, said substrate also carrying packaged semiconductor devices electrically connected to selected circuit leads and a connector electrically connected to selected circuit leads, and said connector extending from said chamber to said one end through said opening; and
   C. said shell including opposed pockets adjacent said opening and said connector including ears that fit into said pockets to retain said connector in said shell.

24. The memory card of claim 23 in which said first part presents said pockets and said second part clamps said ears in said pockets when said first and second parts are joined together.

25. A memory card comprising:
   A. a shell having an interior chamber opening to one end of the shell, said shell presenting generally planar top and bottom surfaces and circumferential edges extending between said top and bottom surfaces, and said shell including gripping means providing plural ridges formed in the material of the shell on opposed edges of said shell opposite said one end of the shell;
   B. a substrate carrying printed circuit leads contained within said chamber, said substrate also carrying packaged semiconductor devices electrically connected to selected circuit leads and a connector electrically connected to selected circuit leads, and said connector extending from said chamber to said one end through said opening.

26. A memory card comprising:
   A. a shell presenting an interior chamber opening to one end of the shell;
   B. a substrate carrying printed circuit leads contained within said chamber, said substrate also carrying packaged semiconductor devices electrically connected to selected circuit leads and a connector electrically connected to selected circuit leads, and said connector extending from said chamber to said one end through said opening; and
   C. said one end of said shell including a portion adjacent said connector that has a thickness less than the rest of said shell and that has a thickness the same as said connector.

27. An electronic system comprising:
   A. an electronic apparatus using memory devices and having a fixed connector exposed to the exterior for receiving a matching connector, said fixed connector being connected to memory address and data leads internal of said apparatus; and
   B. a memory card having a body presenting a matching connector that connects with said fixed connector, said memory card containing memory devices connected to said matching connector, said body having a certain thickness and having a thinned portion adjacent said matching connector that has a thickness less than said certain thickness and substantially the thickness of said connector.

28. The electronic system of claim 27 in which said body has apertures opening to an exterior surface and said memory devices extend through said apertures to have top surfaces that stand at least flush with said exterior surface of said body, said memory card including a flexible cover resting on said top surfaces and on said exterior surface.

* * * * *